| (12) | United States Patent | (10) Patent No.: | US 7,156,705 B2 |
|---|---|---|---|
| | Soh | (45) Date of Patent: | Jan. 2, 2007 |

(54) ELECTRICAL CONNECTOR

(75) Inventor: Lip Teck Soh, Singapore (SG)

(73) Assignee: FCI, Versailles (FR)

( * ) Notice: Subject to any disclaimer, the term of this patent is extended or adjusted under 35 U.S.C. 154(b) by 0 days.

(21) Appl. No.: 10/496,445

(22) PCT Filed: Nov. 23, 2002

(86) PCT No.: PCT/SG02/00273

§ 371 (c)(1),
(2), (4) Date: Feb. 18, 2005

(87) PCT Pub. No.: WO03/049517

PCT Pub. Date: Jun. 12, 2003

(65) Prior Publication Data

US 2005/0176309 A1    Aug. 11, 2005

(30) Foreign Application Priority Data

Nov. 23, 2001    (SG) .............................. 200107293-3

(51) Int. Cl.
*H01R 4/48* (2006.01)
*H01R 12/00* (2006.01)

(52) U.S. Cl. ........................................ 439/862; 439/71

(58) Field of Classification Search ................ 439/862, 439/515, 71, 66, 73
See application file for complete search history.

(56) References Cited

U.S. PATENT DOCUMENTS

| 4,341,433 | A | | 7/1982 | Cherian et al. ....... 339/176 MP |
|---|---|---|---|---|
| 4,511,197 | A | * | 4/1985 | Grabbe et al. ................. 439/69 |
| 5,131,872 | A | * | 7/1992 | Consoli et al. .............. 439/751 |
| 5,437,556 | A | * | 8/1995 | Bargain et al. ................ 439/66 |
| 5,655,913 | A | * | 8/1997 | Castaneda et al. ............. 439/66 |
| 5,980,323 | A | * | 11/1999 | Bricaud et al. .............. 439/630 |
| 6,257,899 | B1 | * | 7/2001 | Walkup ........................ 439/66 |
| 6,280,254 | B1 | * | 8/2001 | Wu et al. .................... 439/630 |
| 6,464,512 | B1 | * | 10/2002 | Morita ......................... 439/66 |
| 6,485,338 | B1 | * | 11/2002 | Wu .............................. 439/862 |

FOREIGN PATENT DOCUMENTS

| EP | 0403206 A2 | 12/1990 |
|---|---|---|
| EP | 0403206 A3 | 12/1990 |

\* cited by examiner

*Primary Examiner*—Hien Vu
(74) *Attorney, Agent, or Firm*—Harrington & Smith, LLP

(57) ABSTRACT

An electrical connector for use between two devices having conductive regions between which an electrical connection is to be formed, the electrical connection comprising, a housing including a passage therethrough, a conductive element of an elongate conductive material disposed within the passage. The conductive element is formed to define an upper contact region and a lower contact region for engagement to an upper the device and a lower the device respectively. Also provided are a location region which secures the conductive element to the housing, a beam region including a first end dependent from the location region and a free end at or towards which the upper contact region is located. The beam is resiliently deflectable to a position wherein the upper device is positioned for use having the upper contact region pressed thereto and wherein the upper contact is biased towards the first position. A fulcrum providing region is positioned. to become engaged with the beam at a region thereof between the first end and the upper contact region during engagement of the upper device prior to the upper contact region reaching the second position.

14 Claims, 2 Drawing Sheets

ELECTRICAL CONNECTOR

BACKGROUND OF INVENTION

The present invention relates to an electrical connector for use between two devices having conductive elements such as printed circuit boards forming part of an electric or electronic circuit.

Examples of prior art connectors for creating an electrical connection between two circuit boards which are for example mounted parallel to each other with the connector located intermediate of the two circuit boards are typified by U.S. Pat. Nos. 4,511,197, 4,341,433, 5,437,556 and 4,505,529. Connectors of this kind are defined by a housing which holds a plurality of conductive elements in a relationship to the housing such that on each side of the housing, each conductive element exposes a nose which can engage with a conductive trace of the printed circuit boards. The conductive elements can engage with such a trace of each circuit board on each side of the housing to thereby create an electrical connection between the two circuit boards. It is important to ensure that an electrical connection is maintained by the conductive elements and accordingly the printed circuit boards are often clamped in position. U.S. Pat. No. 4,505,529 describes the use of a conductive element which has a compression spring arrangement which creates a bias of the conductive element towards the two panels when some degree of deflection of the spring component of the conductive element occurs. The nature of the spring component of the conductive element is such that the highest rate of change of the biasing force generated, occurs at the initial stages of deflection of the spring component.

U.S. Pat. No. 4,511,197 provides a contact assembly which recognises the desirability of minimising impedance and resistive effects and thereby provides a connector which in use provides a shorter path length for the circuit created by the connector.

The conductive element of U.S. Pat. No. 4,511,197 includes a first contact nose and a second contact nose wherein the second contact nose is mounted at the end of a beam portion of the conductive element. The beam cantilevers from a point at the end of the beam away from the contact nose. In moving towards the fully engaged condition a leg extending from the contact nose, becomes engaged with a leg of the conductive element at the first contact nose and thereby creates a movement of the first contact nose to move it in a wiping motion. This motion removes any absorbed films and oxides which may have been deposited on a conductive trace of the circuit board.

U.S. Pat. No. 4,341,433 describes a connector with a conductive element which includes a first region which remains fixed relative to the housing and from which a first nose extends to engage with a conductive trace on a first circuit board and from which another leg extends to act as a spring mounting a nose to engage with a conductive trace on another circuit board. Likewise in U.S. Pat. No. 5,437,556, a first nose of a conductive element is mounted on a spring region of the conductive element and provides a biasing force towards a first circuit board onto which the nose of the conductive element is to engage.

Accordingly it is an object of the present invention to provide electrical connector for use between two devices having variable rate of change of force during engagement of a device with conductive elements or to at least provide the public with a useful choice.

It is also an object of this invention to provide an electrical connector with at least one conductive element which can provide a higher compressive force.

It is a further object of the present invention to present a conductive element with a shorter electrical path upon compression.

BRIEF DESCRIPTION OF THE PRESENT INVENTION

The present invention consists in electrical connector for use between two devices having conductive regions between which an electrical connection is to be formed, said connector comprising a housing including a passage therethrough a conductive element of an elongate conductive material disposed within said passage, said conductive element formed to define:
   an upper contact region and a lower contact region for engagement to an upper said device and a lower said device respectively (preferably to be located on opposite sides of said housing),
   a location region which secures said conductive element to said housing,
   a beam region including a first end dependent from said location region and a free end at or towards which said upper contact region is located,
      wherein said beam is resiliently deflected on engagement of said upper device to displace said upper contact from a first position wherein said beam is in an undeflected state, to a second position wherein said upper device is positioned for use having said upper contact region pressed thereto and wherein said upper contact is biased towards said first position by said then deflected beam
   a fulcrum providing region positioned to become engaged with said beam at a region thereof between said first end and said upper contact region during engagement of said upper device prior to said upper contact region reaching said second position.

Preferably said conductive element further defines a spring region between (and preferably extending from) said location region in a resiliently flexible manner.

Preferably said conductive element further provides an increase in the rate of change of biasing force when said beam becomes engaged with said fulcrum providing region.

Preferably said housing includes a plurality of passages each including a respective conductive elements.

Preferably said upper contact region at least in said first position extends out through a first open end of said passage of said housing.

Preferably said lower contact region extends through another open end of said passage of said housing.

Preferably said lower contact region is provided by a leg of said conductive element extending from said location region.

Preferably said leg extends from said location region on the other side thereof to which said spring region extends from said location region.

Preferably said conductive element has been formed by bending and initially planar preform thereof.

Preferably said spring region extends from said location region to hold said beam region to be substantially resiliently deflectable.

Preferably said upper contact moves from its first position to said second position and visa versa in a direction substantially parallel to the direction of engagement of said upper device with said upper contact.

Preferably said fulcrum providing region provides during engagement thereof with said beam a simple support to said beam between said first and said upper contact.

Preferably said fulcrum providing region is provided by a portion of the conductive element which remains substantially non-displaceable relative to said housing.

Preferably said spring region extends from said location region at the end of said location region distal from where said leg extends.

Preferably said spring region extends between said location region and said first end of said end region in a manner to provide a bending moment resilient spring effect, to allow said resilient deflection of said beam.

Preferably said fulcrum providing region is provided by said conductive element as part of said location region.

This invention may also be said broadly to consist in the parts, elements and features referred to or indicated in the specification of the application, individually or collectively, and any or all combinations of any two or more of said parts, elements or features, and where specific integers are mentioned herein which have known equivalents in the art to which this invention relates, such known equivalents are deemed to be incorporated herein as if individually set forth.

DETAILED DESCRIPTION

Figure 1:
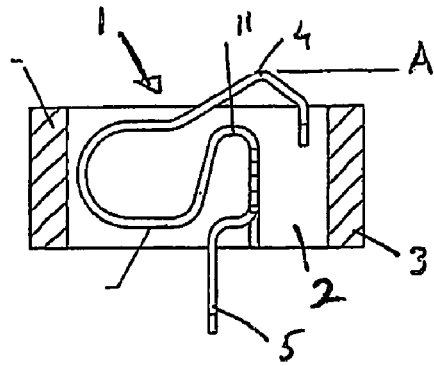
FIG. 1 is a sectional view through a housing showing one cavity in which a conductive element is positioned in a non use state.

With reference to FIG. 1 there is shown in cross section an electrical connector of the present invention. The electrical connector is of a kind which allows for two devices (not shown) which have for example conductive traces or regions such as those found on printed circuit boards to be connected. Indeed the connector of the present invention may provide electrical connection between a printed circuit board as a first device and some other electrical device which may or may not be a printed circuit board.

Shown in FIG. 1 is an electrical connector wherein a single conductive element is provided in a passage of a housing. The electrical connector of the present invention may include a housing wherein a plurality of passages are provided within each of which is provided a conductive element to allow for multiple electrical connections to be formed between the two devices. For simplicity, the present invention is represented in the accompanying drawings with a single conductive element 1 provided in a cavity 2 of the housing 3. The conductive element 1 provides an upper contact region 4 and a lower contact region 5.

The conductive element is preferably made of a conductive material such as a metal which is of a flexible kind and preferably has good resistance to plastic deformation.

Figure 3:
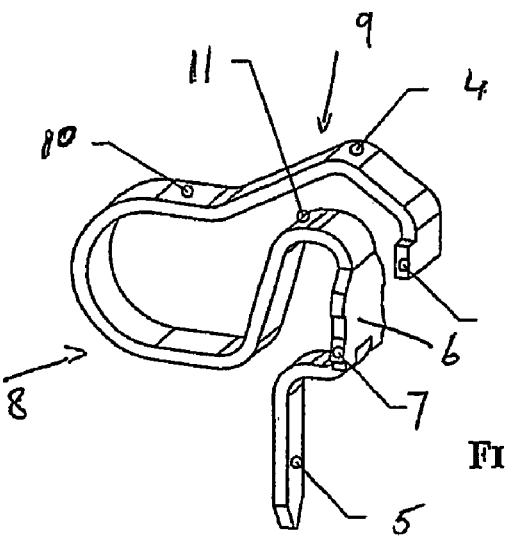
FIG. 3 is a perspective view of a conductive element.

With reference to for example FIG. 3, it can be seen how the conductive element may be formed from a sheet material which has been pressed to define the elongate preform of the conductive element after which it may be formed by bending to the desired shape.

With reference to FIG. 3, the conductive element includes a location region 6 which is able to secure the conductive element to the housing. The cavity 2 of the housing may for example be of a nature where the side walls of the cavity can be utilised to engage with sprags 7 of the location region 6 to thereby securely position the conductive element relative to the housing 3. The sprags may be of a kind which can be pressed into the cavity and have a retention character so that it can remain securely positioned relative to the housing.

The conductive element in its most preferred form further includes a spring region 8 extending from the location region 6, and a beam region 9 which is resilient deflectable as a result of being disposed from said location region by said spring region.

The spring region 8 is between the location region and the beam region 9 and preferably extends from one end of the location region to the first end 10 of said beam region. The beam is resiliently deflectable such that when an upper device is advanced to a position for use, the upper contact region 4 is displaced towards the housing 3.

Figure 2:
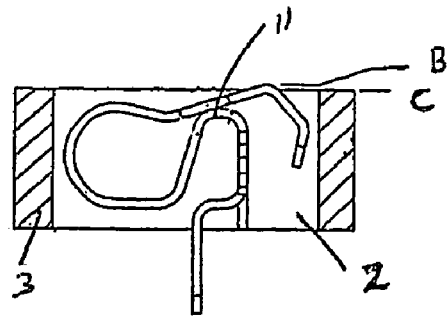
FIG. 2 is a sectional view through a housing showing one cavity in which a conductive element is positioned in a used state (but not showing the electronic or electric devices)
Figure 4:
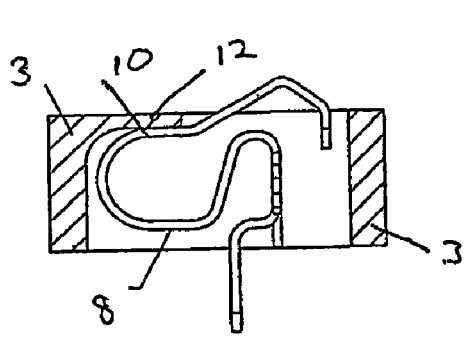
FIG. 4 is an alternative arrangement of the housing in which the conductive element may be located in a non use state.

The upper contact region 4 travels from its first position as for example shown in FIG. 4 denoted by position A to a second position as shown in FIG. 2 denoted by C by the upper device being pressed against the upper connection region 4. The upper connection region 4 preferably is a contact nose formed from the beam 9 and is moved from position A to position C in a direction which is in substantially the same direction from which the upper device is moved to its ultimate position for use.

Figure 9:
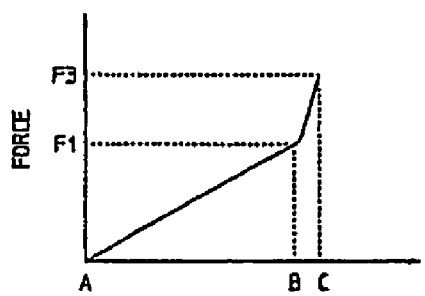
FIG. 9 is a diagram illustrating how the rate of change of force changes as the displacement of the upper contact of the conductive element occurs due to the provision of a fulcrum point which becomes operative during the movement of the upper contact towards its second, fully engaged condition with the electronic device for which the conductive element provides an electrical connection.

Intermediate of the movement of the upper connection region 4 between its first position A and its second position C the beam 9 makes contact with a fulcrum providing region 11. Contact of the beam with the fulcrum providing region occurs at a location intermediate of the first end 10 of the beam and the part of the beam at which the upper contact region 4 is provided. In effect the resilient deflection of the beam over a length between its first end 10 and the upper connection region 4, becomes simply supported intermediate thereof by said fulcrum providing region 11. Such simple support provides a reactive force in a direction opposite to the direction of displacement of the beam in its deflection moving the upper contact region from its first position to its second position. When engaged the simple support provides more resilience to but still allows deflection of the beam. Upon engagement of the fulcrum providing region with the beam, biasing of the upper contact region back towards it first position increases as a result of this extra support. FIG. 9 illustrates a graph of displacement of the upper contact region and the force required for its displacement. From this it can be seen that towards the end of travel during engagement of an upper device with the upper contact region 4, the biasing force of the upper contact region towards the upper device is increased at a greater rate as it displaces towards the second position, once the fulcrum makes contact.

Whilst as indicated in FIG. 9, the force-displacement curve is linear along the two regions pre and post contact of the fulcrum, the characteristics of the material or geometry of the conductive element may be such as for these regions to be non-linear. It can however be seen that a high contact force can be achieved without any plastic deformation of the material of the contact element occurring. This can lead to a connector design of lower cost, finer pitch and lower weight.

Figure 5:
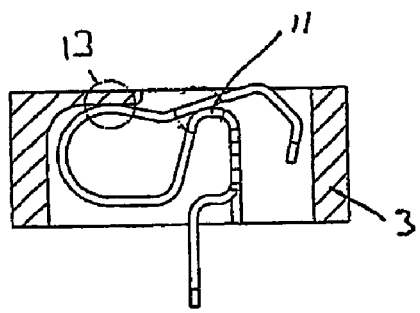
FIG. 5 is a view of the arrangement of FIG. 4 but wherein the conductive element has been compressed.

With reference to FIGS. 4 and 5, a further adaptation may be provided such that part of the housing 3 is able to coact with the conductive element to further increase the rigidity of the resilient displacement of the beam and hence the upper contact once the fulcrum providing region engages with the beam. The housing 3 is provided with a beam contact region 12 able to contact the beam at or towards it first end 10. Contact between the beam and the contact region 12 of the housing occurs as for example shown as region 13 in FIG. 5. The reactive force provided to the beam at its first end 10 by the contact region 12 will increase once the beam makes contact with the fulcrum providing region 11 and as the upper contact region displaces further towards it second position and as the beam makes contact with the fulcrum 11. The beam contact region 12 will resist any upward movement of the first end of the beam as the upper contact region 4 travels downward towards its second position. Resistance to further travel of the upper contact region towards its first position is then largely as a result of the bending moment strength of the beam. The effect of the spring region 8 in providing the resilience to the beam is then reduced. The contact region 12 in effect also provides simple support to the beam but with a reactive force in a direction opposite to the fulcrum.

Figure 6:
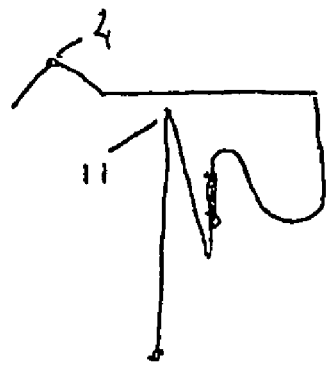
FIG. 6 is an illustration of an alternative form of the conductive element of the present invention.
Figure 7:
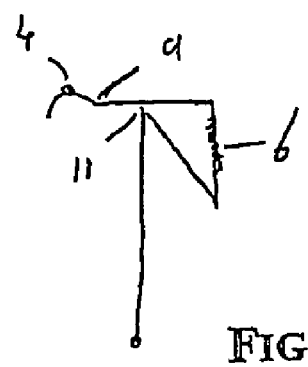
FIG. 7 is a further alternative illustration of a conductive element of the present invention.
Figure 8:
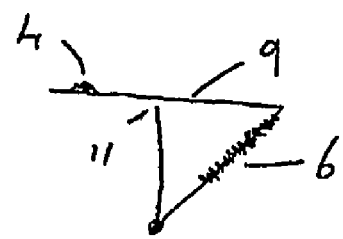
FIG. 8 is still a further alternative to the conductive element of the present invention.

With reference to FIG. 6–8, alternative configurations of a contact element for use in the present invention are shown. Whilst in the most preferred form the beam as shown in FIG. 3 is resiliently displaceably attached to a spring region 8, with reference to FIGS. 7 and 8, the beam 9 may be provided in a cantilevered relationship from the connection region 6 and wherein resilient flexibility is provided by the beam 9 as a result of its bending moment flexural rigidity.

FIGS. 6–8 also illustrate that the fulcrum providing region does not necessarily need to be provided as part of the connection region 6. The geometry of the connection element may be such as to provide a fulcrum region 11 which will remain substantially resistant to displacement once the beam makes contact with the fulcrum providing region in the displacement of the upper contact 4 towards the second position. Whilst in the most preferred form the fulcrum providing region 11 is provided at or proximate to the location region 6 of the conductive element so that it has good resistance to displacement, the geometry of the conductive element may still present a fulcrum providing region 11 along the length of the conductive element in positions away from the location region 6. The fulcrum may be located at either end of the location region, intermediate of the ends of the location region or may be provided as a region, an extrusion from either end of the location region. The fulcrum providing region 11 may also provide a location of the conductive element to the housing in addition to the location region 6.

In addition to providing a simple support for the beam, the fulcrum providing region once it makes contact with the beam creates a second path for the flow of electricity from the upper contact region to the lower contact region via part of the beam, through the location region to the lower contact region thereby shorting the flow path of electricity by not having to travel through the spring region. It is appreciated in electronics that a reduced flow path for electricity provides benefits of reduced resistance and impedance.

The invention claimed is:

1. An electrical connector for use between two devices having conductive regions between which an electrical connection is to be formed, said electrical connection comprising a housing including a passage therethrough a one-piece conductive element of an elongate conductive material disposed within said passage, said conductive element formed to define:

an upper contact region and a lower contact region for engagement to an upper said device and a lower said device respectively, a location region connecting between the upper and the lower contact regions which secures said conductive element to said housing, a beam region including a first end and a second end, wherein the beam region extends from the first end proximate the location region towards the second end proximate the upper contact region, wherein said beam region is resiliently deflected on engagement of said upper device to displace said upper contact region from a first position wherein said beam region is in an undeflected state, to a second position wherein said upper device is positioned for use having said upper contact region pressed thereto and wherein said upper contact region is biased towards said first position by said beam region after the beam region is deflected, a fulcrum providing region positioned between the first end and the location region to be engaged with said beam region at a region of the beam region between said first end and said upper contact region during engagement of said upper device prior to said upper contact region reaching said second position, and wherein during engagement of said upper device to said upper contact region the upper contact region is at least partially deflected in a general direction towards said free end after said beam region contacts said fulcrum providing region, wherein said conductive element further defines a spring region between said location region and said beam region, and wherein said conductive element further provides an increase in the rate of change of biasing force when said beam region becomes engaged with said fulcrum providing region.

2. An electrical connector as claimed in claim 1 wherein said housing includes a plurality of passages each including a respective conductive element.

3. An electrical connector as claimed in claim 1 wherein said upper contact region at least in said first position extends out through a first open end of said passage of said housing.

4. An electrical connector as claimed in claim 1 wherein said lower contact region extends through another open end of said passage of said housing.

5. An electrical connector as claimed in claim 1 wherein said lower contact region is provided by a leg of said conductive element extending from said location region.

6. An electrical connector as claimed in claim 1 wherein said leg extends from said location region at an end thereof opposite to the end to which said spring region extends from said location region.

7. An electrical connector as claimed in claim 1 wherein said conductive element has been formed by bending and initially planar preform thereof.

8. An electrical connector as claimed in claim 1 wherein said upper contact moves from said first position to said second position and visa versa in a direction substantially parallel to the direction of engagement of said upper device with said upper contact region.

9. An electrical connector as claimed in claim 1 wherein said fulcrum providing region is provided by a portion of the conductive element which remains substantially non-displaceable relative to said housing.

10. An electrical connector as claimed in claim 1 wherein said fulcrum providing region is provided by said conductive element as part of said location region.

11. An electrical connector as claimed in claim 1 wherein the conductive element is sized and shaped to provide:
   a first biasing force-to-displacement rate by the upper contact region against the upper device as the upper contact region is deflected between the undeflected first position and a fulcrum contacting position of the beam region and before the fulcrum contacting portion of the beam contacts the fulcrum providing region, and
   a second different biasing force-to-displacement rate by the upper contact region against the upper device after the fulcrum contacting portion of the beam region contacts the fulcrum providing region and as the upper contact region is deflected between the fulcrum contacting position and the second position.

12. An electrical connector for use between an upper device and a lower device, the electrical connector comprising:
   a housing including a passage therethrough;
   a one-piece conductive element of an elongate conductive material disposed within the passage, the conductive element formed to define:
      an upper contact region to electrically contact with the upper device;
      a lower contact region to electrically contact with the lower device;
      a location region connecting between the upper and lower contact regions to secure the conductive element to the housing;
      a beam region including a first end and a second end, wherein the beam region extends from the first end proximate the location region towards the second end proximate the upper contact region, wherein the beam region is resiliently deflected on engagement of the upper device to displace the upper contact region from a first position, wherein the beam region is in an undeflected state, to a second position, wherein the upper device is positioned for use having the upper contact region pressed thereto, and wherein the upper contact region is biased towards the first position by the beam region after the beam region is deflected; and
      a fulcrum providing region positioned to become engaged with the beam region between the first end and the upper contact region during engagement of the upper device and before the upper contact region reaches the second position,
   wherein said conductive element further defines a spring region between said location region and said beam region, and wherein said conductive element further provides an increase in the rate of change of biasing force when said beam region becomes engaged with said fulcrum providing region.

13. An electrical connector as claimed in claim 12 wherein the conductive element is sized and shaped to provide:
   a first biasing force-to-displacement rate by the upper contact region against the upper device as the upper contact region is deflected between the undeflected first position and a fulcrum contacting position of the beam region and before the fulcrum contacting portion of the beam contacts the fulcrum providing region, and
   a second different biasing force-to-displacement rate by the upper contact region against the upper device after the fulcrum contacting portion of the beam region contacts the fulcrum providing region and as the upper contact region is deflected between the fulcrum contacting position and the second position.

14. An electrical connector for use between an upper device and a lower device, the electrical connector comprising:
   a housing including a passage therethrough;
   a one-piece electrical contact disposed within the passage, the electrical contact comprising:
      an upper contact region to electrically contact with the upper device;
      a lower contact region to electrically contact with the lower device;
      a fulcrum between the upper and lower contact regions; and
      a beam including a first end and a second end, wherein the beam extends from the first end proximate the location region towards the second end proximate the upper contact region, wherein the beam is resiliently deflectable from an undeflected position to a fully deflected position, wherein in the undeflected position a fulcrum contacting portion of the beam is spaced from the fulcrum, and wherein the contact is sized and shaped such that on engagement of the upper device with the upper contact region to displace the upper contact region from the undeflected position to a fully deflected position, the fulcrum contacting portion of the beam contacts the fulcrum,
   wherein the contact provides a first biasing force-to-displacement rate by the upper contact region against the upper device as the upper contact region is deflected between the undeflected position and the fulcrum contacting position and before the fulcrum contacting portion of the beam contacts the fulcrum, and
   wherein the contact provides a second different biasing force-to-displacement rate by the upper contact region against the upper device after the fulcrum contacting portion of the beam contacts the fulcrum and as the upper contact region is deflected between the fulcrum contacting position and the fully deflected position,
   wherein said conductive element further defines a spring region between said location region and said beam region.

* * * * *